United States Patent
Oster

(10) Patent No.: US 11,762,722 B2
(45) Date of Patent: Sep. 19, 2023

(54) METHOD FOR PROTECTING A RECONFIGURABLE DIGITAL INTEGRATED CIRCUIT AGAINST REVERSIBLE ERRORS

(71) Applicant: THALES, Courbevoie (FR)

(72) Inventor: Yann Oster, Toulouse (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 17/881,649

(22) Filed: Aug. 5, 2022

(65) Prior Publication Data
US 2023/0051943 A1    Feb. 16, 2023

(30) Foreign Application Priority Data

Aug. 12, 2021  (FR) ...................................... 2108653

(51) Int. Cl.
*G06F 11/07*       (2006.01)
*G01R 31/3185*    (2006.01)
(Continued)

(52) U.S. Cl.
CPC ...... *G06F 11/0751* (2013.01); *G01R 31/3187* (2013.01); *G01R 31/31917* (2013.01);
(Continued)

(58) Field of Classification Search
CPC ............. G06F 11/0751; G06F 11/1641; G01R 31/318572; G01R 31/3187; G01R 31/31917; H03K 19/17728; H03K 19/007
See application file for complete search history.

(56) References Cited

U.S. PATENT DOCUMENTS 7,340,643 B2 * 3/2008 Grochowski ......... G06F 9/3857
                                                    714/10
9,250,992 B1 * 2/2016 Tam ....................... G11C 29/36
(Continued)

FOREIGN PATENT DOCUMENTS

EP    3 392 773 B1    10/2019
FR    3 065 601 A1    10/2018

OTHER PUBLICATIONS

N. Z. Haron, S. Hamdioui and Z. Ahyadi, "ECC design for fault-tolerant crossbar memories: A case study," 2010 5th International Design and Test Workshop, Abu Dhabi, United Arab Emirates, 2010, pp. 61-66. (Year: 2010).*
Parhami, "RNS Representations with Redundant Residues", Conference Record of Thirty-Fifth Asilomar Conference on Signals, Systems and Computers (Cat.No. 01CH37256), 2011.
Etzel et al., "Redundant Residue number systems for error detection and correction in digital filters", IEEE Transactions on Acoustics, Speech, and Signal Processing, vol. 28, Issue: 5, pp. 538-545, Oct. 1980.

(Continued)

*Primary Examiner* — Cynthia Britt
(74) *Attorney, Agent, or Firm* — BakerHostetler

(57) ABSTRACT

A method for protecting a reconfigurable digital integrated circuit includes multiple parallel processing channels each comprising an instance of a functional logic block and an error detection unit, the method comprising the successive steps of: activating the error detection unit in order to detect an error in at least one processing channel, executing the data replay mechanism, and then activating the error detection unit in order to detect an error in at least one processing channel, if an error is detected again, executing a self-test on each processing channel, for each processing channel, if the self-test does not detect any error, executing the data replay mechanism for this processing channel, if the self-test detects an error, reconfiguring that part of the configuration memory associated with this processing channel.

15 Claims, 12 Drawing Sheets

(51) Int. Cl.
*G01R 31/3187* (2006.01)
*G01R 31/319* (2006.01)
*H03K 19/17728* (2020.01)
*G06F 11/16* (2006.01)

(52) U.S. Cl.
CPC .. *G01R 31/318572* (2013.01); *G06F 11/1641* (2013.01); *H03K 19/17728* (2013.01)

(56) References Cited

U.S. PATENT DOCUMENTS

| | | | |
|---|---|---|---|
| 10,018,675 B1 * | 7/2018 | Titley | G01R 31/3187 |
| 10,594,321 B1 * | 3/2020 | Funyu | G06F 30/34 |
| 2018/0267099 A1 * | 9/2018 | Van Den Heuvel | G01R 31/31703 |
| 2019/0303260 A1 | 10/2019 | Ozer et al. | |

OTHER PUBLICATIONS

James, et al., "Error Correction based on redundant residue number system", 2015 IEEE International Conference on Electronics, Computing and Communication Technologies (CONECCT), 2015.

Ebrahim, et al., "A fast and scalable FPGA damage diagnostic service for R3TOS using BIST cloning technique", 2014 24th International Conference on Field Programmable Logic and Applications (FPL), 2014.

Agarwal, et al., "State model for scheduling Built-in Self-Test and scrubbing in FPGA to maximize the system availability in space applications", India International Conference on Power Electronics 2010 (IICPE2010), 2011.

Pham, et al., "Low-overhead fault-tolerance technique for a dynamically reconfigurable softcore processor", IEEE Transactions on Computers, vol. 62, No. 6, pp. 1179-1192, Jun. 2013.

* cited by examiner

METHOD FOR PROTECTING A RECONFIGURABLE DIGITAL INTEGRATED CIRCUIT AGAINST REVERSIBLE ERRORS

CROSS-REFERENCE TO RELATED APPLICATION

This application claims priority to foreign French patent application No. FR 2108653, filed on Aug. 12, 2021, the disclosure of which is incorporated by reference in its entirety.

FIELD OF THE INVENTION

The invention relates to the field of reconfigurable digital integrated circuits, or programmable logic circuits such as FPGA (field-programmable gate array) circuits.

More specifically, the invention relates to mechanisms for protecting such digital integrated circuits against reversible errors caused in particular by radiation to which these circuits are subjected.

BACKGROUND

Digital integrated circuits may be subjected to radiation or ionizing particles that lead to transient or reversible errors on the circuit and interfere with its nominal operation.

In the case of airborne or aerospace applications, digital integrated circuits are exposed to the effects of ionizing radiation coming from the external environment. To a lesser extent, even for applications on board ground-based systems, the housings in which the circuits are encapsulated generate alpha radiation that leads to errors with occurrence that is all the higher when the circuits are complex and comprise a very high number of logic gates.

The effects produced by radiation on a circuit may be gradual or singular. In the first case, the defects generated by the radiation build up gradually until they generate errors starting from a certain accumulated radiation dose threshold. In the second case, a single ionizing particle or a single event may generate an immediate defect that may affect the memories, the flip-flops or the logic gates contained in the circuit. If the defect generates inversion of a bit, reference is made to a "single event upset" (SEU), and if on the other hand it impacts multiple bits, reference is made to a "multiple-bit upset" (MBU). The effects of the radiation may take the form of leaks or pulses that propagate in the circuit and affect the combinational logic on an electrical wire or on a logic gate (reference is made to a "single event transient" (SET) in this case). These errors (SEU, MBU, SET) are reversible and affect only the interpretation of the electrical signals in the sequential and combinational logic, resulting in logic errors that impact the circuit.

Moreover, what are referred to as COTS "commercial off-the-shelf" circuits are generally more sensitive to reversible errors than circuits using a specific strengthened technology, leading to errors at the output of the functions, or even to persistent modifications of the implanted functions.

Transient errors may affect the internal state of the machines for the functions (on the application level) or even the configuration memory (on the function configuration level), which defines the circuit implanted with the resources of the circuit. Indeed, reconfigurable FPGA circuits have a configuration that is stored in memory that defines the functionality to be implemented. Configuration memories are for example memories using SRAM or flash technology. SRAM memories are in particular highly sensitive to reversible errors.

Generally speaking, an error that impacts a configuration memory causes configuration errors with the circuit, leading to incorrect functionalities being implemented.

There is therefore a need for a protection mechanism with the role of masking the impact of reversible errors on reconfigurable integrated circuits, whether these errors act on the logic functions of the circuit or on the configuration memory.

The protection mechanism should be intended to tolerate all types of reversible error while creating limited complexity and consumption. Moreover, the impact of the protection mechanism on the processing speed of the circuit should be limited and should not lead to any service interruption.

French patent application FR 3065601 from the Applicant proposes a mechanism for protecting against transient errors for FPGA or ASIC circuits. This solution makes it possible to correct the effect of reversible errors on the logic of the circuit, but it does not make it possible to take into account the effect of errors on the configuration memory of the circuit.

One known mechanism for correcting the effect of errors on a configuration memory consists in using a radiation-insensitive redundant memory, for example a reference ROM memory. A comparison is performed at regular intervals between the SRAM configuration memory and the reference ROM memory.

Another solution consists in periodically reprogramming the configuration memory so as to make a preventive correction.

Other solutions are based on the use of error correction codes or error detection codes.

All of these solutions have drawbacks in terms of service interruption, operating speed and/or excess consumption caused for the circuit.

SUMMARY OF THE INVENTION

The invention proposes a mechanism for protecting a reconfigurable digital integrated circuit against reversible errors that takes into account the impact of the errors both on the logic of the circuit and on the configuration memory.

The proposed mechanism works without any service interruption, has limited complexity and a limited impact on the operating speed of the circuit that is protected.

One subject of the invention is thus a method for protecting a digital integrated circuit reconfigurable by way of a configuration memory against reversible errors, the digital integrated circuit comprising multiple parallel processing channels each comprising an instance of a functional logic block and an error detection unit for detecting errors based on the outputs from the processing channels, the circuit implementing a data replay mechanism and a self-test mechanism, the method comprising the successive steps of:
  activating the error detection unit in order to detect an error in at least one processing channel,
  if an error is detected by the error detection unit, executing a self-test on each processing channel,
  for each processing channel,
    i. if the self-test does not detect any error, executing the data replay mechanism for this processing channel,
    ii. if the self-test detects an error, reconfiguring at least that part of the configuration memory associated with this processing channel.

According to one particular embodiment of the invention, the method furthermore comprises the following steps, executed immediately after the first step of activating the error detection unit:

in response to an error detected by the error detection unit in at least one processing channel, executing the data replay mechanism for each processing channel, and then activating the error detection unit in order to detect an error in at least one processing channel.

According to one particular embodiment of the invention, the step of executing the data replay mechanism comprises the substeps of:

resetting the functional logic block, executing, at a speed greater than the nominal execution speed of the integrated circuit, the functional logic block for past data saved in a buffer memory.

According to one particular embodiment of the invention, the step of executing a self-test on a processing channel comprises the substeps of:

interrupting nominal operation of the processing channel, executing the functional logic block for self-test data generated by the self-test mechanism, comparing the output from the functional logic block with predefined data corresponding to expected operation of the processing channel.

According to one particular variant, the method according to the invention furthermore comprises a step of synchronizing, after reconfiguration, the processing channel for which an error was detected by the self-test with the other processing channels.

According to one particular embodiment of the invention, the step of detecting an error in at least one processing channel consists at least in comparing the outputs from all of the processing channels and in declaring the presence of an error if all of the outputs are not identical.

According to one particular embodiment of the invention, the numbers processed by the digital integrated circuit are encoded, in accordance with a modular representation system, by what are referred to as RNS residues in which the numbers are expressed in an RNS representation base defined by a plurality of mutually coprime moduli, a number being encoded by a vector in which each component corresponds to the modulo of the number by a modulo of the RNS base, each processing channel being intended to process a component and the set of processing channels comprising at least one channel associated with a redundant component.

According to one particular embodiment of the invention, the step of detecting an error in at least one processing channel consists at least in:

converting the components at the output of the set of processing channels into a number, detecting an error if this number exceeds the dynamic range of the RNS base without redundancy.

According to one particular embodiment of the invention, the input dynamic range of the numbers processed by the digital integrated circuit is able to be adapted so as to indiscriminately associate at least one processing channel with a redundant component.

Another subject of the invention is an assembly of at least one reconfigurable digital integrated circuit comprising multiple parallel processing channels each comprising an instance of a functional logic block, a configuration memory of the at least one circuit, an error detection unit for detecting errors based on the outputs from the processing channels and a controller, each circuit implementing a data replay mechanism and a self-test mechanism for the processing channels, the controller being configured to command the elements of the at least one digital integrated circuit so as to implement a method for protecting against reversible errors according to the invention.

According to one particular embodiment, said assembly comprises an input FIFO memory for supplying each processing channel with samples, an output FIFO memory for receiving samples from the error detection unit, a buffer memory supplied with samples by the input FIFO memory, the controller being able to command read access to the input FIFO memory and write access to the output FIFO memory and being configured to execute a replay mechanism consisting in resetting each functional logic block, suspending read access to the input FIFO memory, suspending write access to the output FIFO memory and switching the input of the processing channels to the output of the buffer memory.

According to one particular embodiment, said assembly furthermore comprises a self-test stimulus generator able to generate an input self-test sequence, a memory comprising a self-test sequence expected at the output of each block and an error detection unit able to compare the sequence obtained at the output of each functional logic block by injecting, at input, the input self-test sequence with the expected self-test sequence stored in the second memory.

According to one particular embodiment of the invention, each functional logic block furthermore comprises a modulo logic operator able to be applied to the input data and in which the logic functions of the functional logic block are implemented via a projection onto a component of an RNS base.

According to one particular embodiment, said assembly furthermore comprises a module for framing the numbers at the input of each functional logic block in order to adapt their dynamic range.

According to one particular embodiment, said assembly comprises a source integrated circuit, multiple slave integrated circuits and a master integrated circuit, the various processing channels being distributed among the various slave integrated circuits.

BRIEF DESCRIPTION OF THE DRAWINGS

Other features and advantages of the present invention will become more clearly apparent upon reading the following description with reference to the following appended drawings.

DETAILED DESCRIPTION

Figure 1:
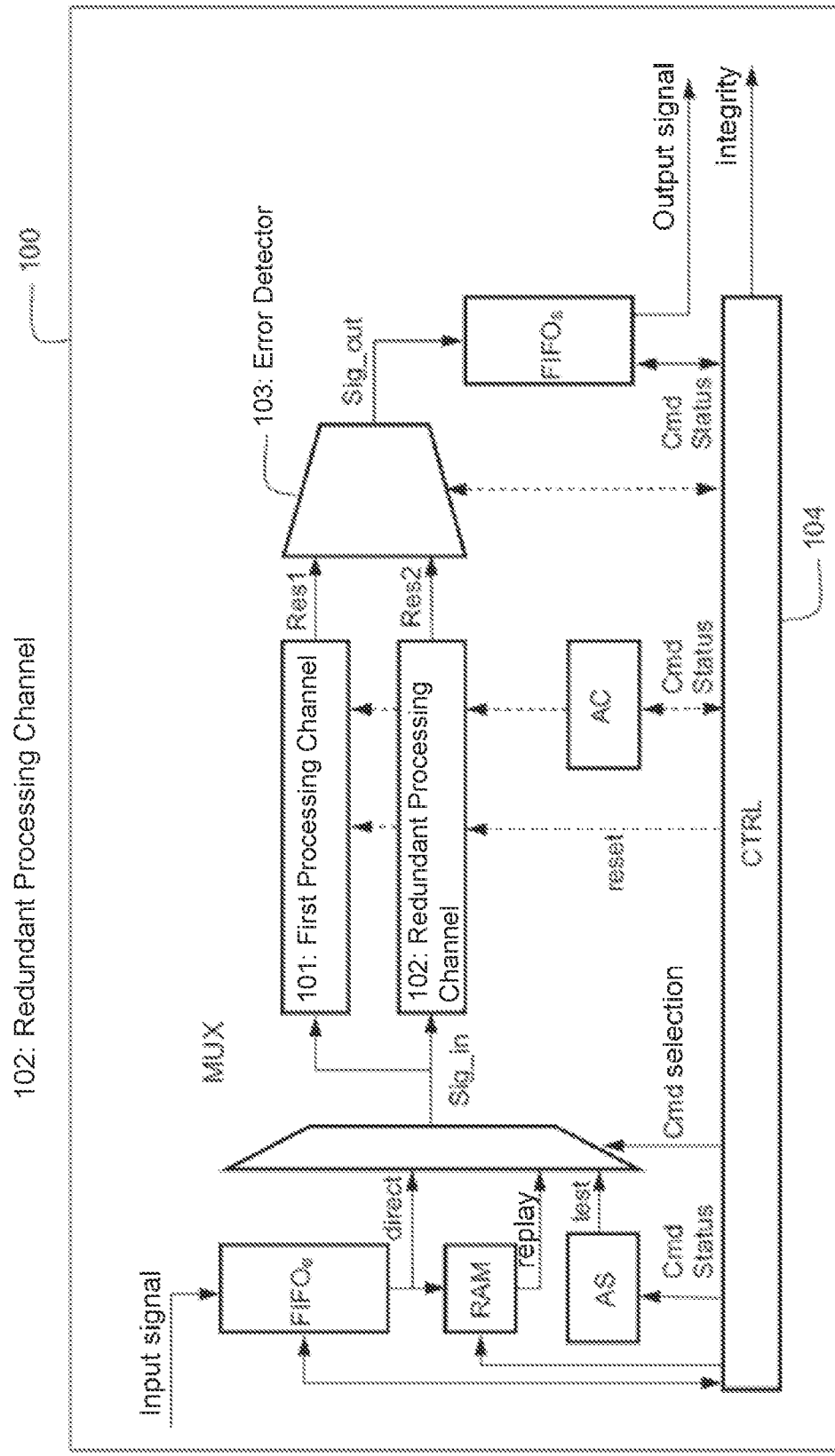
FIG. 1 shows a functional diagram of a digital integrated circuit integrating a mechanism for protecting against reversible errors according to a first embodiment of the invention.

FIG. 1 shows a functional diagram of a digital integrated circuit 100 according to a first embodiment of the invention. The circuit 100 primarily comprises two processing channels 101, 102, an error detection unit 103 and a controller 104.

The first processing channel 101 implements one or more logic functions in the form of a functional logic block BLF. The second processing channel 102 is a redundant channel that implements a replica of the logic functions of the first processing channel 101. The inputs of the circuit 100 are transmitted in parallel to the two channels 101, 102.

The two processing channels 101, 102 also implement a replay mechanism that will be explained below.

The error detection unit 103 is configured to compare the outputs from the two processing channels 101, 102 and detect an error if the two outputs are not identical.

The error detection unit 103 also plays the role of a multiplexer for routing the output from one of the processing channels to an output FIFO memory $FIFO_s$. The outputs from the circuit 100 are read from the output memory $FIFO_s$. Optionally, additional information regarding the integrity of the output is produced with the output itself.

The controller 104 is configured, in response to an error detected by the unit 103, to command certain detection mechanisms.

The circuit 100 also comprises a configuration memory (not shown in FIG. 1) that contains the information needed to program the logic resources of each processing channel, in other words that makes it possible to program the functional logic blocks so that they execute a predefined function.

Each processing channel 101, 102 comprises a functional logic block BLF performing a function sensitive to reversible errors. The functional logic block BLF may correspond to an elementary logic function or to a set of logic functions that are interconnected so as to perform a particular processing operation. The functional logic block BLF is programmed from the configuration memory of the circuit (not shown in FIG. 1).

The circuit 100 comprises an input FIFO memory $FIFO_e$ for receiving the input data for the circuit in the form of samples and supplying the input of the functional logic block BLF of each processing channel 101, 102.

The input FIFO memory and the output FIFO memory are filled in real time in accordance with a known principle called the first in first out principle. The input FIFO memory is supplied by the upstream functional processing operations. The output FIFO memory supplies data to the downstream functional processing operations.

The circuit 100 also comprises a buffer memory, for example a RAM memory.

The buffer memory is filled in real time with the L last samples read from the input FIFO memory, L being the size of the buffer memory.

The circuit 100 also comprises a self-test stimulus generator AS able to produce a predefined self-test sequence, and a self-test control unit AC able to compare the output from the functional logic block with an expected sequence in order to detect an error. As an alternative, the self-test sequence AS may be stored in a memory.

The controller 104 is able to command the various elements of the circuit. In particular, the controller 104 commands the activity of each processing channel, read access to the input FIFO memory and write access to the output FIFO memory. It also commands read access to the RAM buffer memory and the activity of the self-test stimulus generator AS and of the self-test control unit AC.

The circuit 100 also comprises a multiplexer MUX controlled by the controller 104 so as to connect the input of each processing channel either to the output of the input FIFO memory or to the output of the RAM buffer memory or to the output of the self-test stimulus generator AS.

Figure 2:
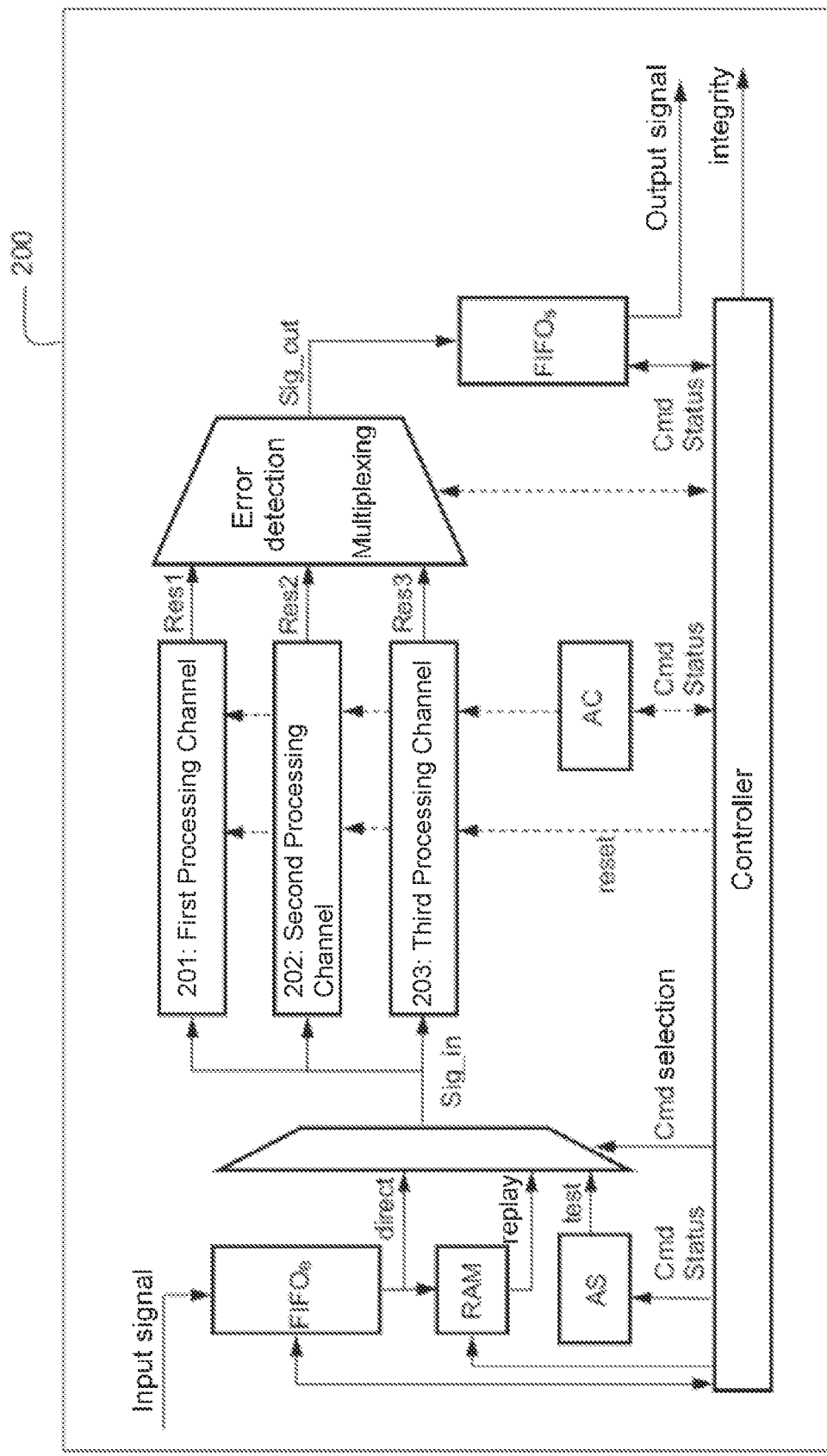
FIG. 2 shows a variant embodiment of the circuit of FIG. 1.

FIG. 2 shows one variant embodiment of the circuit of FIG. 1 for which the circuit 200 comprises three processing channels 201, 202, 203. Generally speaking, the number of processing channels operating in parallel is an integer N at least equal to 2.

Figure 4:
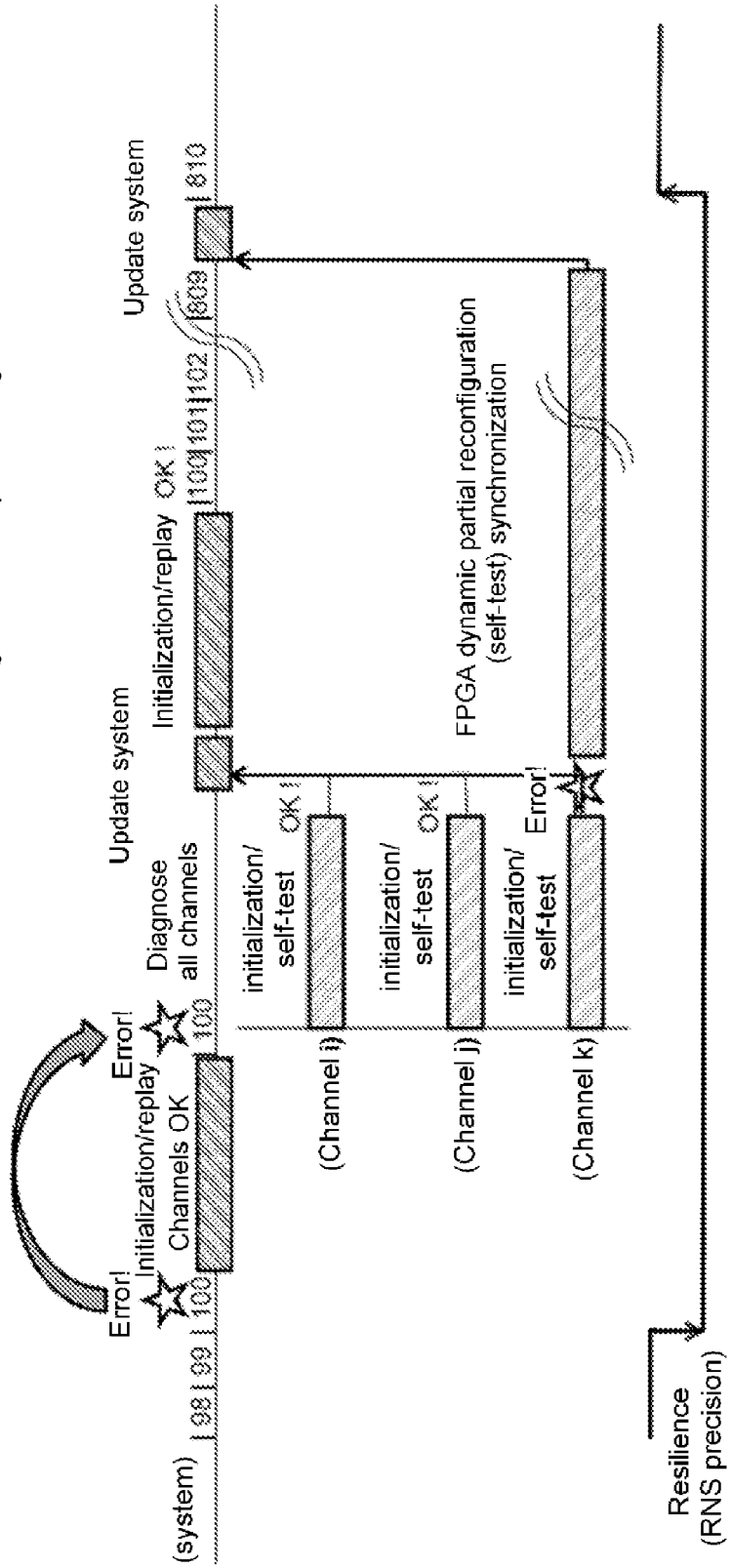
FIG. 4 shows a diagram of the sequencing of the steps of a method for protecting a digital integrated circuit, according to the first embodiment of the invention.
Figure 5:
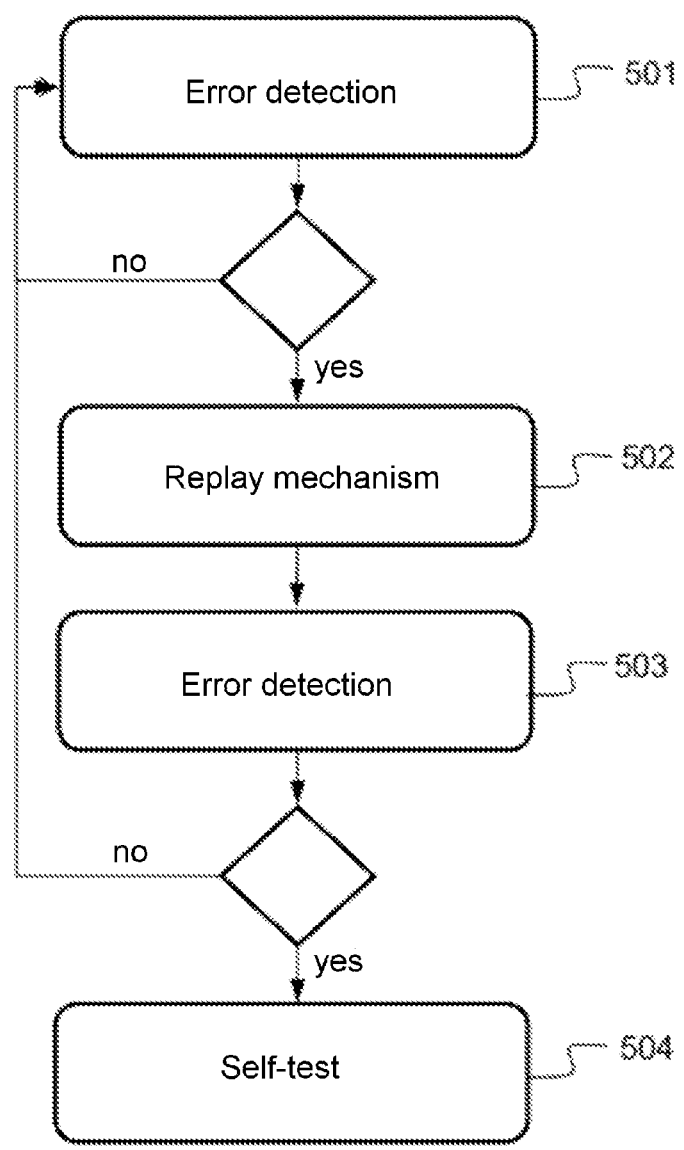
FIG. 5 shows a flowchart of the steps of the method described in FIG. 4.

FIGS. 4 and 5 describe the sequence of the protection method according to the invention on a circuit of the type of FIGS. 1 and 2 comprising N processing channels.

The first step 501 of the method consists in activating the error detection unit 103 in order to compare the outputs from the processing channels and to detect an error if these outputs are different. This step consists of a redundancy-based approach that makes it possible to detect an error in one of the processing channels without knowing which one or knowing its origin and which functionality the error has impacted. The error may in particular concern the internal state of the functional logic block BLF (memories, registers) or concern the content of the configuration memory that defines the functionality that is implemented.

To identify the origin of the error, the method then consists in separately processing the case of an error impacting the functional logic block BLF or the configuration memory.

If no error is detected, the method loops back to step 501 in order to continuously monitor the occurrence of differences between the outputs from the various processing channels that are considered to be operational.

If an error is detected, then the method moves to step 502 with the execution of a data replay mechanism for each operational processing channel.

This mechanism consists in activating reading, from the RAM buffer memory, of the L last samples saved in this memory in order to reinject them at the input of the functional logic block BLF of each operational processing channel and to re-execute the functionality implemented for these samples.

This mechanism may be implemented in line with the teaching of patent FR 3065601 from the Applicant.

When an error is detected, the controller 104 provisionally bars writing to the output FIFO memory $FIFO_s$, provisionally bars reading from the input FIFO memory $FIFO_e$, resets the functional logic block BLF of each processing channel, and then commands read access to the RAM buffer memory in order to supply a sequence of samples, before the error, to the input of each processing channel in order to restore the logic state of the channels. The switch from the input of the channels of the input FIFO memory $FIFO_e$ to the RAM buffer memory may be performed by way of a multiplexer MUX or any other equivalent means. Each functional logic block BLF then executes its processing operation on the data read from the RAM buffer memory, which are identical to the data already processed before and that led to an incorrect result due to a transient error. Upon command of the controller, the RAM buffer memory stops storing the samples read from the input FIFO memory $FIFO_e$ for as long as the internal state of the functional block BLF has not been completely restored.

During nominal operation, that is to say when no error is detected, the samples are read directly from the input FIFO memory. In parallel, the L last samples read from the input FIFO memory are stored at all times in the RAM buffer memory, which is connected to the input FIFO memory. The size L of the RAM buffer memory is linked directly to the latency of the functional logic block BLF. It is at least equal to this latency, expressed as a number of samples. Indeed, the RAM buffer memory has the role of retaining, at all times, the L last samples read from the input FIFO memory in order to allow restoration of the internal state of the functional logic block BLF and replaying of the function performed by the functional logic block BLF on these L last samples if a reversible error occurs. The term "replay" is used to designate a new execution of the processing operation performed by a functional logic block on the same samples as in the previous sequence.

The design of a circuit protected according to the invention consists of two separate clock domains.

The input FIFO memory and the output FIFO memory are synchronous dual-port and dual-clock memories, also denoted using the acronym "dual-clock FIFO", which are interfaced between the two clock domains. In other words, each FIFO memory has an input port associated with a first clock and an output port associated with a second clock. This makes it possible to decouple the data rate between the external clock domain and the accelerated internal clock domain. The external clock domain corresponds to the input and output interfaces of the protected system. The internal clock domain corresponds to the internal logic interfacing with the input FIFO $FIFO_e$ and the output FIFO $FIFO_s$.

The other elements of the protected circuit are clocked at a speed higher than the nominal average operating speed of the input and output interfaces of the circuit, falling within the external clock domain.

The acceleration of the operating speed of the protection system makes it possible to compensate for the delay caused by the additional processing operations needed for error correction in order to conserve error-free operation at the nominal average speed as can be observed at the output interfaces of the protected system.

Those skilled in the art may refer to patent application FR 3065601 for more details about the sequencing of the processing operations during the execution of the replay mechanism in order to ensure continuity of service.

The method then continues with a new error detection step 503 of comparing the outputs from the processing channels.

If all of the outputs are identical and no error is detected, this means that the error was transient and impacted only the internal state of a functional logic block.

If, by contrast, an error is detected again, then this means that it impacts the configuration memory of the circuit.

In this case, the method continues with a step 504 of executing a self-test for each processing channel.

The self-test mechanism consists in suspending the nominal processing operation performed by the processing channels by interrupting reading from the input FIFO memory $FIFO_e$ and writing to the output FIFO memory $FIFO_s$.

The controller 104 then activates the production, by the self-test stimulus generator, of a self-test sequence and commands the multiplexer MUX so that this sequence is supplied to the input of the functional logic blocks. The self-test sequence is a predefined test sequence stored in a memory AS or generated from a circuit generating a deterministic signal.

The controller 104 also activates routing of the output from each functional logic block BLF to the self-test control unit AC, which compares this output with an expected sequence tabulated in a memory. The expected sequence takes into account the desired configuration of the functional logic block BLF, that is to say the configuration obtained by programming from the configuration memory, which is assumed to be error-free.

The self-test mechanism thus makes it possible to detect whether an error has impacted the configuration memory for each processing channel independently.

The diagram of FIG. 4 shows the temporal sequencing of the steps of the method according to the invention. Upon receipt of the sample numbered 100, the error detection unit 103 detects an error and a replay step 502 is activated for all of the channels. At the end of this step, an error is detected again on the sample numbered 100 by the error detection unit 103. Diagnostics on all of the channels are then triggered via an independent self-test on each channel.

At the end of this step, the channels i and j are declared error-free and may be conserved for executing the nominal processing operation, but the self-test performed on the channel k makes it possible to identify an error. For the channel k, dynamic partial reconfiguration of the configuration memory, limited to this channel, is performed. During this reconfiguration, the system is updated so as to take into account the fact that the channel k is temporarily out of service. A replay mechanism is activated on the channels i and j in order to resume the execution of the nominal processing operation, up to the sample numbered 100, and then reading from the input FIFO memory is again activated on these channels i and j.

When the reconfiguration of the configuration memory has finished (on the sample 809 in the example of FIG. 4), the system is updated so as to take into account the fact that the channel k is operational again. Time synchronization is performed in order for the processing operation performed by the channel k to be synchronous with the processing operations performed by the other channels i and j.

In one variant embodiment of the method described in FIGS. 4 and 5, steps 502 of executing a replay mechanism and 503 of error detection are removed. In this case, step 504 of executing a self-test mechanism for each processing channel is performed directly when an error is detected at the end of the first error detection step 501. If the self-test detects an error, then this means that the error impacts that part of the configuration memory associated with the processing channel that should be reconfigured. If the self-test does not detect any error, then the data replay mechanism is then executed for the associated processing channel. One advantage of this variant is that it makes it possible to process errors impacting the configuration memory of the circuit first of all and transient errors second of all.

Figure 6:
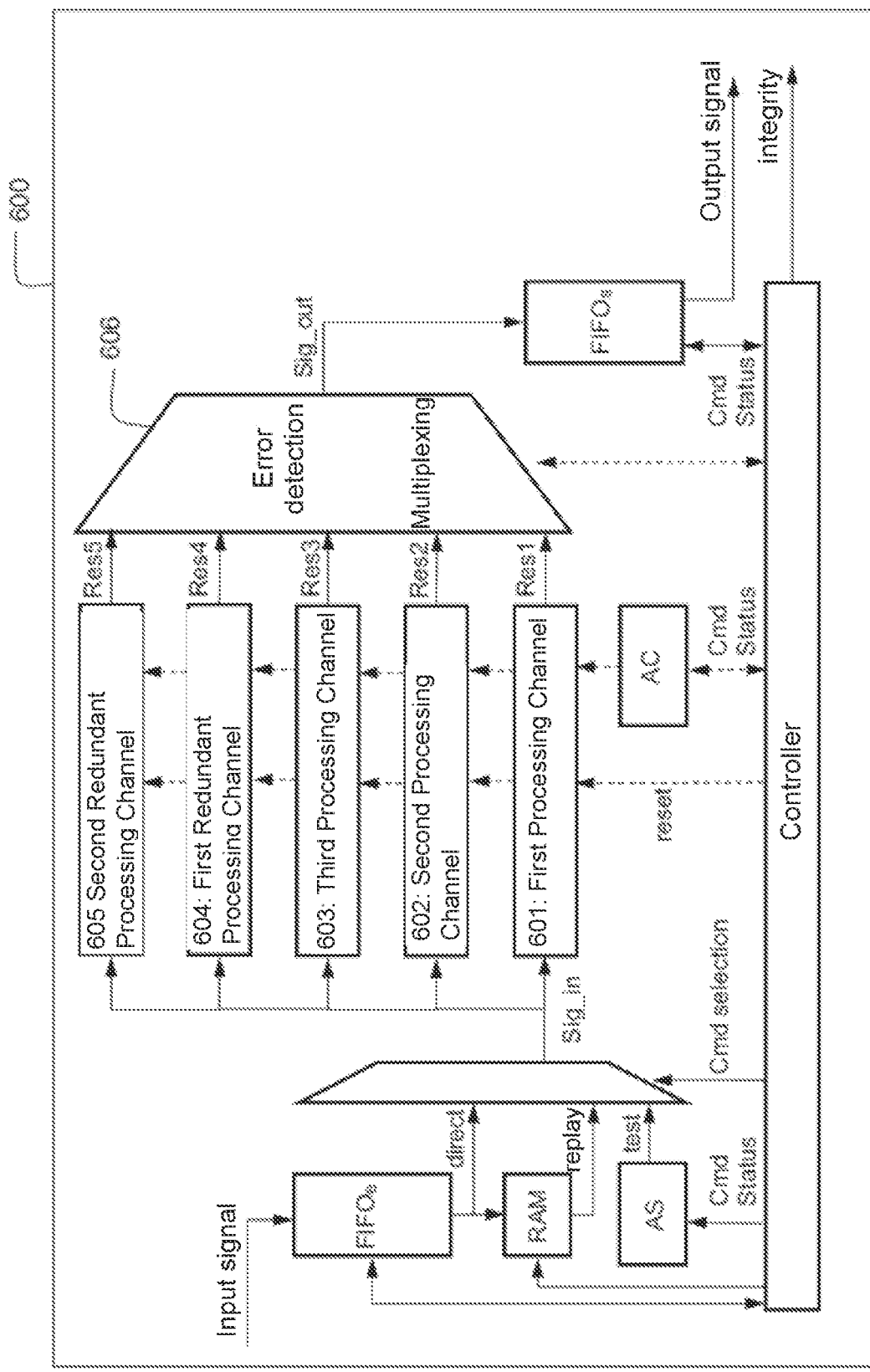
FIG. 6 shows a functional diagram of a digital integrated circuit integrating a mechanism for protecting against reversible errors according to a second embodiment of the invention.

FIG. 6 schematically shows a second embodiment of a circuit 600 according to the invention, in which the input data for the circuit are encoded using a modular and redundant residue number representation system, or "redundant residue number system" (RRNS).

The modular residue number representation system or RNS system is a mathematical tool used to vectorize data propagated in a circuit in order to reduce computational complexity. Indeed, this representation method makes it possible to reduce computations on large values to computations performed in parallel on numbers of a chosen small size.

Those skilled in the art may refer to documents [1], [2] and [3] for details regarding the implementation of RNS or RRNS techniques.

A modular representation system is defined by an RNS base of multiple mutually coprime integers, called moduli. For example, the triplet $\{3,5,7\}$ is an RNS base. More generally, $\{m_1, m_2, \ldots m_n\}$ denotes an RNS base and M denotes the product of the moduli $m_i$ of the base. Any positive integer X less than M may be represented uniquely in this RNS base by the n-tuple $\{x_1, \ldots x_n\}$ where $x_i$=X mod $m_i$, mod denoting the modulo function. Each modulus makes it possible to form an RNS component of a number.

This representation is used in the embodiment of the invention described in FIG. 6. Each input datum X is decomposed onto an RNS base and each element $x_i$ of this decomposition is supplied to the input of a separate processing channel. The example of FIG. 6 shows 5 processing channels 601, 605, but the number of channels is an integer N at least equal to 2.

It is also possible to expand the RNS base $\{m_1, m_2, \ldots m_p\}$ with additional components so as to form an expanded RRNS base $\{m_1, m_1, \ldots m_p, m_{p+1}, \ldots m_{p+t}\}$. In this case, there are p primary moduli and t additional moduli. The t additional moduli $m_{p+1}, \ldots m_{p+t}$ should be greater than those of the initial base $\{m_1, m_2, \ldots m_p\}$.

In such an RRNS base, it is still possible to decode a positive number X less than the product M of the primary moduli, based on only p arbitrary components out of the p+t components of the redundant base.

This principle is used by the invention to have p primary processing channels 601, 602, 603 and t redundant processing channels 604, 605. In the example of FIGS. 6, p=3 and t=2.

Figure 3:
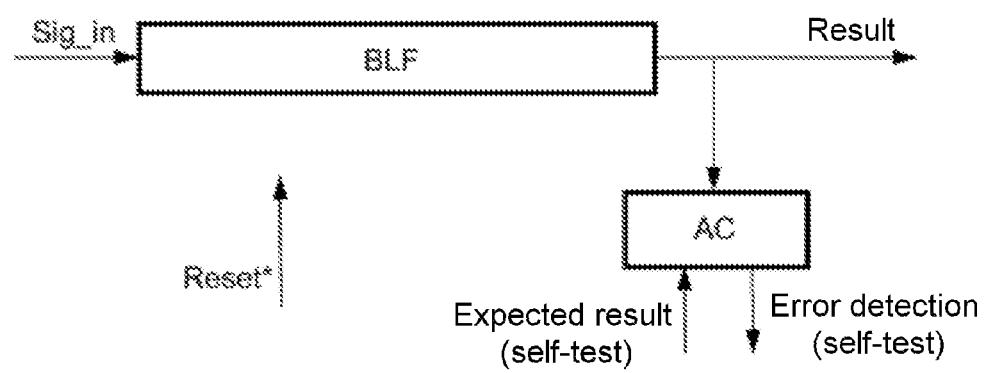
FIG. 3 shows a functional diagram of a processing channel of the digital integrated circuit according to the first embodiment of the invention.
Figure 8:
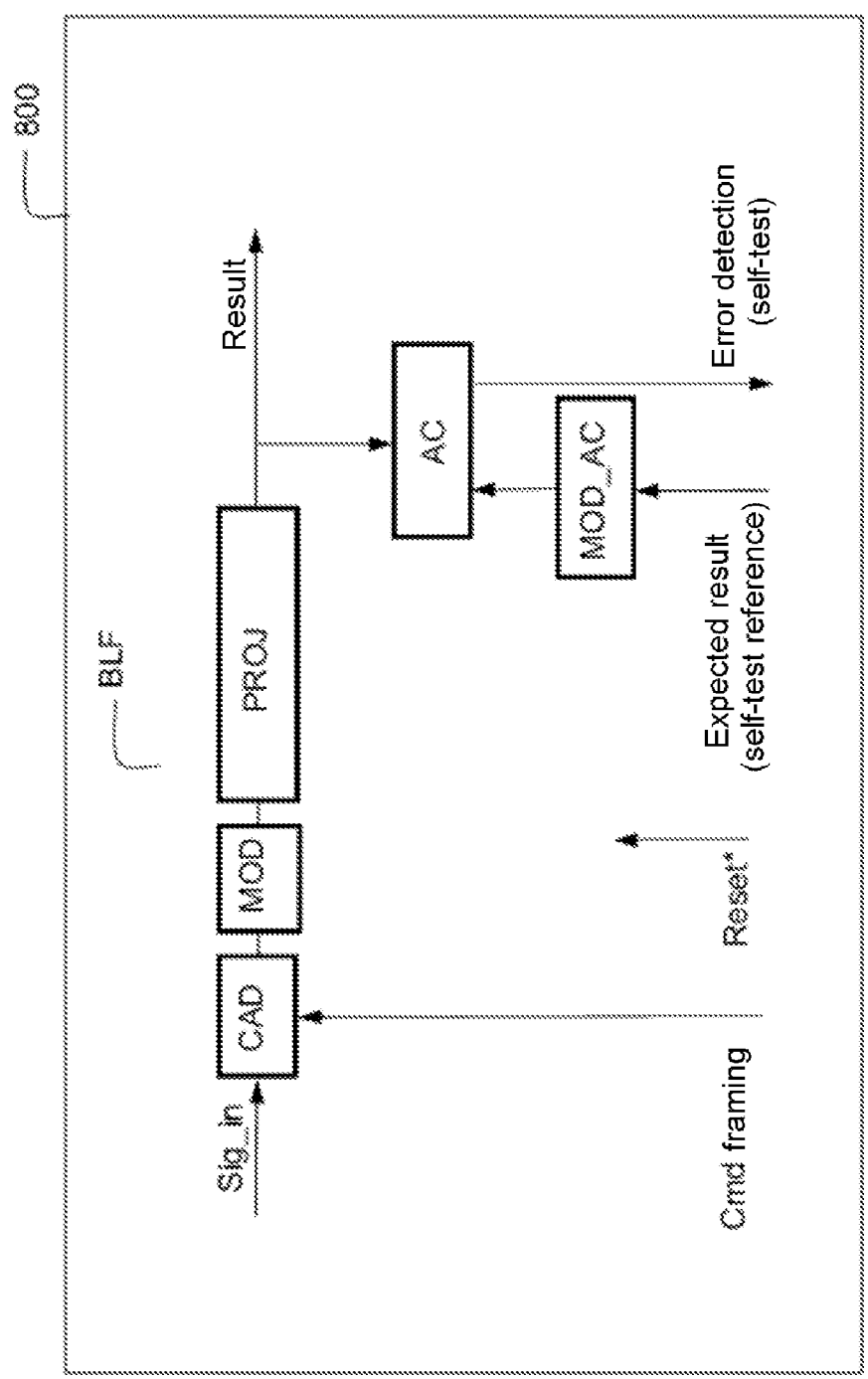
FIG. 8 shows a functional diagram of a processing channel of the digital integrated circuit according to the second or the third embodiment of the invention.

FIG. 8 shows one variant embodiment of a processing channel compatible with the second embodiment of the invention. In addition to the elements already described for FIG. 3, the processing channel 800 of FIG. 8 comprises a functional logic block BLF that implements a modulo function $m_i$ MOD applied to the input data, where $m_i$ is one of the components of the RNS base, each processing channel using a different component. Moreover, the one or more implemented elementary logic functions are projected modulo the component $m_i$. In other words, this means that the operations that are performed are adapted to the reduced number format. The implementation of this projection is denoted PROJ in FIG. 8.

The error detection unit 606 performs error detection based on all of the outputs from the various processing channels 601-605 in two steps using a known technique described in documents [1-3]. The first step consists in decoding the number X based on its components in the redundant RNS base, obtained at the output of each processing channel. This decoding step may be performed by way of a Chinese remainder theorem algorithm or using a mixed radix conversion (MRC) technique. These two techniques are described in document [3]. Other decoding methods are conceivable without departing from the scope of the invention.

The second step consists in comparing the decoded number X with the dynamic range M of the initial RNS base:

$$M=\Pi_{i=1}^{p} m_i.$$

In the example of FIG. 6, the primary components are those associated with the processing channels 601 to 603.

By construction, for any error configuration impacting between one and t RNS components of the number X (that is to say occurs on any one of the processing channels, including the redundant channels 604, 605), then the result of the decoding of the number X is necessarily greater than M. This property is inherent to RRNS redundant modular representation systems as explained in document [2].

Thus, through simple comparison of the number X with M, it is possible to deduce therefrom whether an error has occurred on a subset of the components, therefore on a subset of the processing channels.

The sequence of the steps of the protection method according to the invention applies in the same way (replay and self-test mechanism).

Adding redundant processing channels makes it possible to ensure continuity of service by maintaining the correction capability when one of the processing channels experiences a partial reconfiguration and is thus inoperative for a certain period. In particular, adding t redundant channels makes it possible to tolerate simultaneous errors in t channels. Indeed, the numbers may be decoded correctly as long as any p channels are operational (p=3 in the example of FIG. 6).

Figure 7:
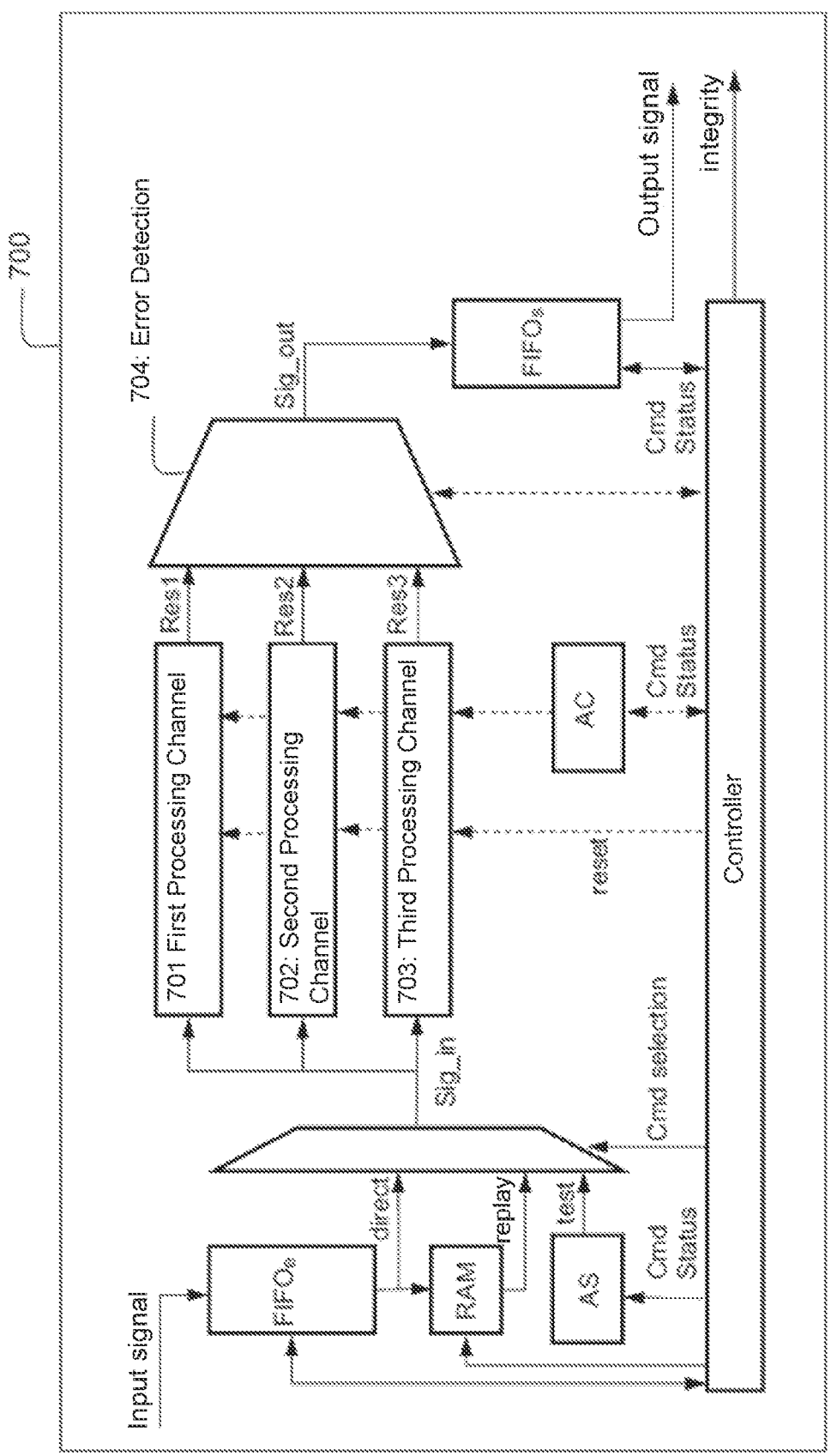
FIG. 7 shows a functional diagram of a digital integrated circuit integrating a mechanism for protecting against reversible errors according to a third embodiment of the invention.

FIG. 7 schematically shows a third embodiment of the circuit according to the invention. This third embodiment is still based on a representation of the numbers in a modular representation system, but this time the number of redundant components (and therefore of redundant channels) is not fixed a priori, but may be adapted based on the need for correction capability, by adapting the dynamic range of the numbers at the input of the circuit. For example, in a first use, no redundant processing channel is provided, the dynamic range of the decodable numbers being equal to $M=\Pi_{i=1}^{N} m_i$, where N is the total number of processing channels (N=3 in the example of FIG. 7). This non-redundant RNS configuration does not make it possible to detect errors by comparing the outputs from the processing channels. Mobilizing a modulus $m_3$ by way of redundancy forms an RRNS base with two primary moduli $\{m_1, m_2\}$, thereby making it possible to detect an error on any component out of the three. It is also possible to dynamically increase the correction capability by mobilizing two moduli $\{m_2, m_3\}$ for redundancy, but the dynamic range of the decodable numbers is reduced to $m_1$.

This configuration makes it possible to adapt the tolerance to the errors by adapting the dynamic range of the numbers.

To implement this variant embodiment, each processing channel 800 has to integrate a dynamic range framing module (CAD) at the input of the functional logic block BLF (see FIG. 8). This module is commanded by the controller 104 based on the desired configuration.

The error detection unit 704 is also designed to take into account the number t of redundant processing channels in order to configure the comparison threshold for the error detection.

Thus, in order to maintain a correction capability, the dynamic range of the numbers may be reduced following detection of an SRAM configuration error, the time to configure the one or more processing channels diagnosed as inoperative through a self-test. Once the errors have been corrected, the dynamic range of the numbers may be increased again.

Generally speaking, this third embodiment makes it possible to achieve a compromise between computing precision and the desired level of tolerance to errors. It also allows this compromise to be managed dynamically.

The invention is applicable to a reconfigurable digital integrated circuit or to a set of reconfigurable circuits operating together as a single circuit. In this case, the error detection units and the control units of the various circuits are interfaced in order to share information for coordinating the set of processing channels distributed among the various circuits.

In particular, in one variant embodiment, the processing channels are distributed among a set of at least two reconfigurable slave digital integrated circuits connected to a master circuit.

Generally speaking, the operation is identical to the case of protecting a single integrated circuit, with the same functions and mechanisms, distributed and replicated in various integrated circuits.

FIGS. 9, 10, 11 and 12 show one exemplary embodiment of this variant.

Figure 9:
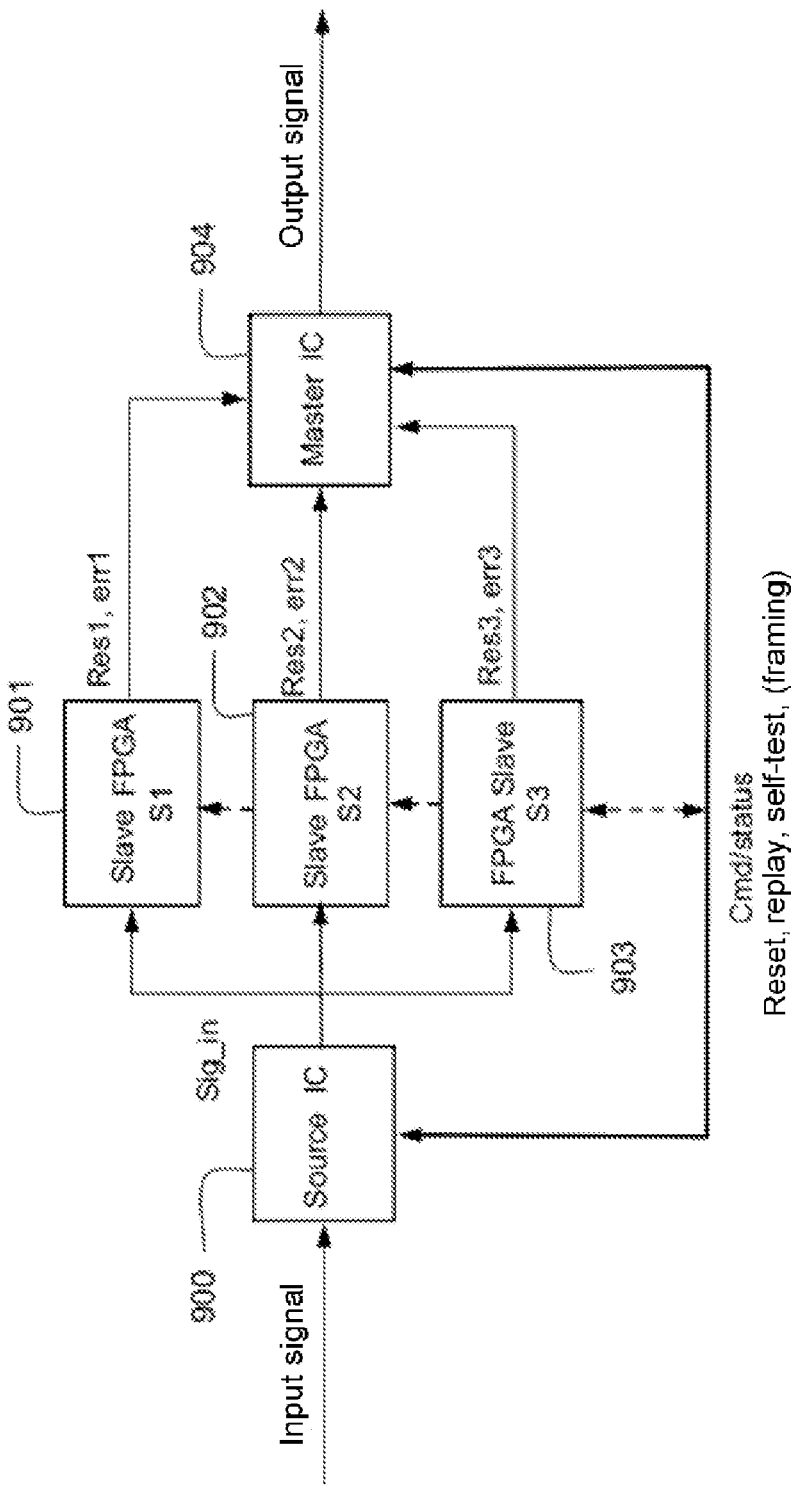
FIG. 9 shows another variant embodiment of the invention for which the processing circuits are distributed among various integrated circuits.

FIG. 9 illustrates a diagram of a set of reconfigurable integrated circuits comprising a source circuit 900, multiple slave circuits 901, 902, 903 and a master circuit 904. The processing channels are distributed among the various slave circuits 901, 902, 903.

Figure 10:
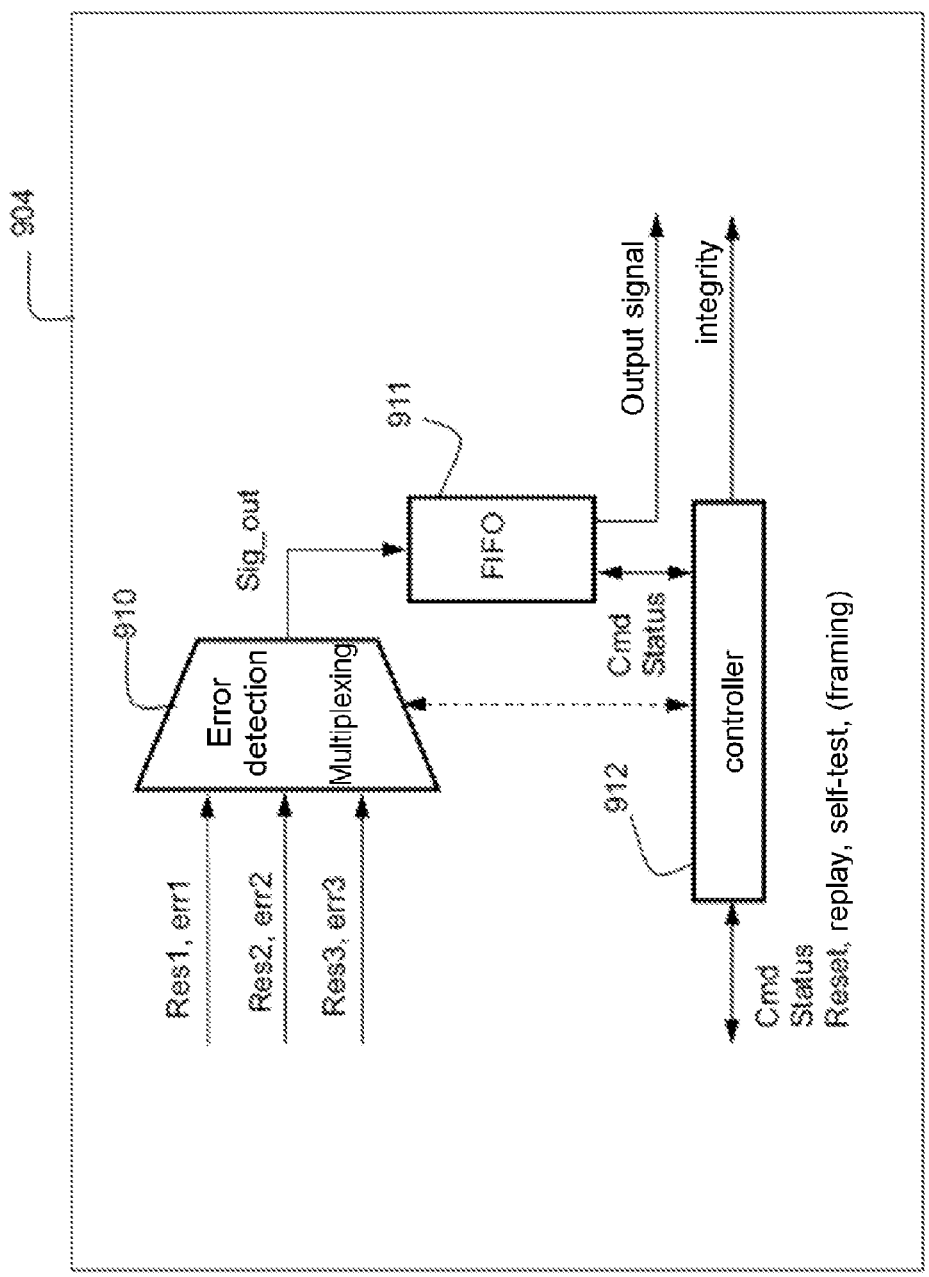
FIG. 10 shows a functional diagram of a master integrated circuit according to the variant shown in FIG. 9.

FIG. 10 shows a diagram of a master circuit 904. The master circuit 904 integrates a primary controller 912, a multiplexing and error detection module 910 or error detection unit for taking into account the results from all of the slave circuits 901, 902, 903, an output FIFO memory 911 for storing the validated results and for performing decoupling between the local processing speed and the propagation speed of data to the downstream logic. The error detection is performed as in the case of a digital circuit by reconstructing the number X based on the partial results res1, res2, res3 produced by the slave circuits.

Figure 11:
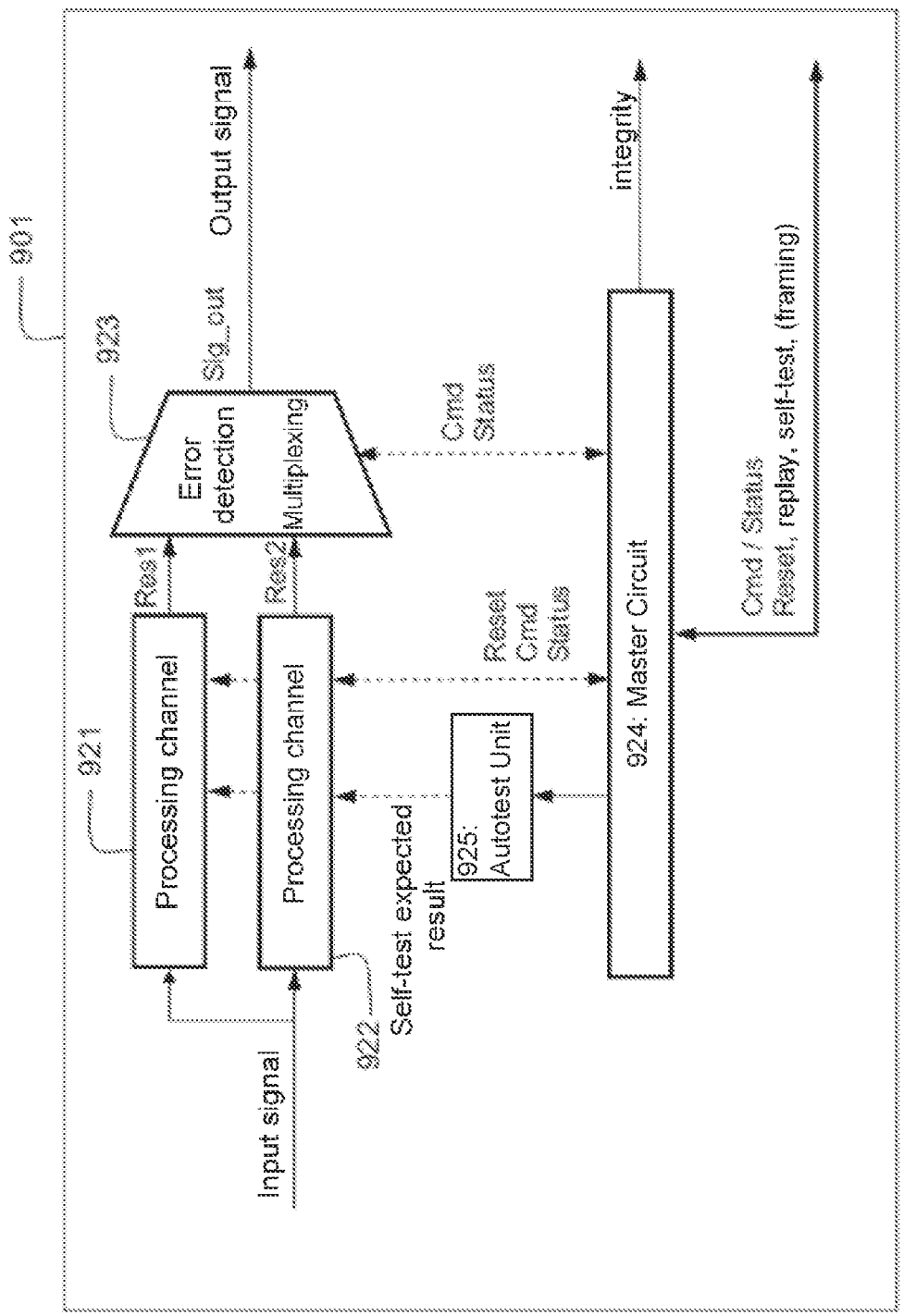
FIG. 11 shows a functional diagram of a slave integrated circuit according to the variant shown in FIG. 9.

FIG. 11 shows a diagram of a slave circuit 901. The slave integrated circuit 901 comprises a subset of processing channels 921, 922, along with a multiplexing and error detection module 923 or error detection unit for detecting errors by comparing the outputs from these channels, a local controller 924 for driving the processing channels and the multiplexing and error detection module. This local controller 924 is itself driven by the primary controller 912 of the master circuit 904 coordinating the operation of the slave circuits. The slave integrated circuit 901 also comprises a self-test control unit 925, which may be integrated directly into each processing channel as a variant. In the case of a slave circuit implanting a single processing channel, the multiplexing and error detection module 923 is of no use.

Figure 12:
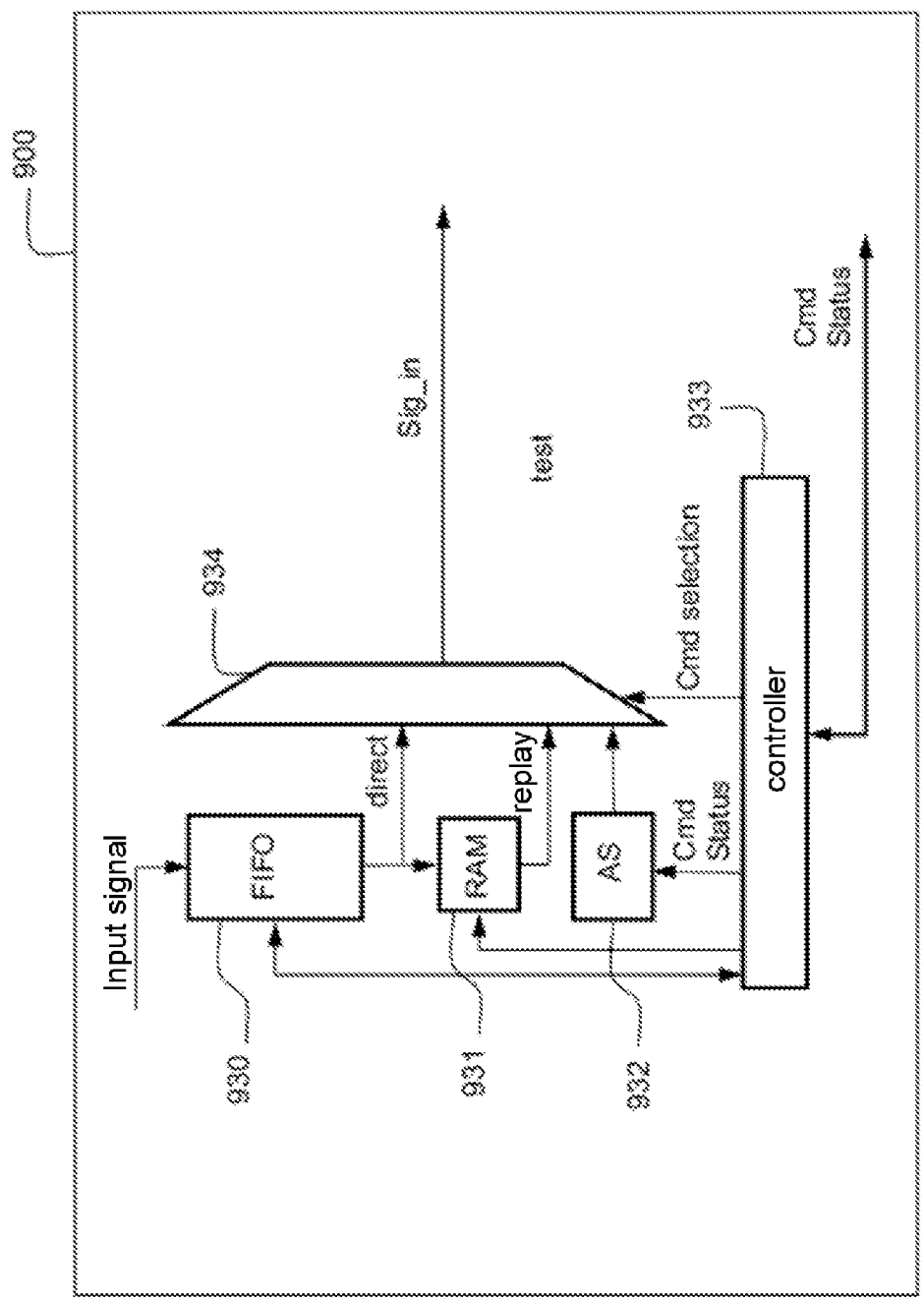
FIG. 12 shows a functional diagram of a source integrated circuit according to the variant shown in FIG. 9.

FIG. 12 shows a diagram of the source circuit 900. It comprises an input FIFO memory 930, a RAM memory 931, a self-test stimulus generator 932, a local controller 933 and a multiplexer 934.

Generally speaking, the various elements of the integrated circuit protected according to the invention as described for a single circuit are identical for an application to multiple integrated circuits, these elements being distributed among the various circuits (source, slave and master) as indicated in FIGS. 10, 11 and 12.

The invention notably offers the following technical advantages over the solutions from the prior art.

It allows protection against the effect of errors both in the logic of the functions implemented by the reconfigurable circuit, but also in the content of the configuration memory, specifically without any service interruption.

The correction mechanisms are triggered only when necessary, that is to say when an inconsistency is detected on the outputs from the operational processing channels.

The mechanisms that are implemented are fast, notably because they make it possible to reconfigure only the processing channels whose configuration has been impacted by an error and to preserve continuity of service through the other operational processing channels.

The invention is of low logic complexity for a given level of resilience. In particular, the third embodiment of the invention makes it possible to adapt the correction capability through the proportion of the resources assigned to redundancy for error detection (redundant processing channels) by adapting the RNS dynamic range.

REFERENCES

[1] "RNS Representations with Redundant Residues, Behrooz Parhami"
[2] "Redundant Residue number systems for error detection and correction in digital filters, Mark H. Etzel et al."
[3] "Error Correction based on redundant residue number system, Jilu James et al"

The invention claimed is:

1. A method for protecting a digital integrated circuit reconfigurable by way of a configuration memory against reversible errors, the digital integrated circuit comprising multiple parallel processing channels each comprising an instance of a functional logic block and an error detector for detecting errors based on outputs from the processing channels, the circuit implementing a data replay mechanism and a self-test mechanism, the method comprising the successive steps of:
   activating the error detector in order to detect an error in at least one processing channel, and
   when an error is detected by the error detector, executing a self-test on each processing channel,
   for each processing channel,
      i. if the self-test does not detect any error, executing the data replay mechanism for this processing channel, or
      ii. if the self-test detects an error, reconfiguring at least that part of the configuration memory associated with this processing channel.

2. The method for protecting a digital integrated circuit according to claim 1, furthermore comprising the following steps, executed immediately after a first step of activating the error detector:
   in response to an error detected by the error detector in at least one processing channel, executing the data replay mechanism for each processing channel, and then
   activating the error detector in order to detect an error in at least one processing channel.

3. The method for protecting a digital integrated circuit according to claim 1, wherein the step of executing the data replay mechanism comprises the substeps of:
   resetting the functional logic block, executing, at a speed greater than the nominal execution speed of the integrated circuit, the functional logic block for past data saved in a buffer memory.

4. The method for protecting a digital integrated circuit according to claim 1, wherein the step of executing a self-test on a processing channel comprises the substeps of:
interrupting nominal operation of the processing channel,
executing the functional logic block for self-test data generated by the self-test mechanism,
comparing an output from the functional logic block with predefined data corresponding to expected operation of the processing channel.

5. The method for protecting a digital integrated circuit according to claim 1, furthermore comprising a step of synchronizing, after reconfiguration, the processing channel for which an error was detected by the self-test with the other processing channels.

6. The method for protecting a digital integrated circuit according to claim 1, wherein the step of detecting an error in at least one processing channel consists at least in comparing the outputs from all of the processing channels and in declaring a presence of an error if all of the outputs are not identical.

7. The method for protecting a digital integrated circuit according to claim 1, wherein numbers processed by the digital integrated circuit are encoded, in accordance with a modular representation system, by what are referred to as RNS residues wherein the numbers are expressed in an RNS representation base defined by a plurality of mutually coprime moduli, a number being encoded by a vector in which each component corresponds to a modulo of the number by a modulo of the RNS base, each processing channel being intended to process a component and a set of processing channels comprising at least one channel associated with a redundant component.

8. The method for protecting a digital integrated circuit according to claim 7, wherein the step of detecting an error in at least one processing channel consists at least in:
converting the components at an output of the set of processing channels into a number,
detecting an error if this number exceeds a dynamic range of the RNS base without redundancy.

9. The method for protecting a digital integrated circuit according to claim 7, wherein an input dynamic range of the numbers processed by the digital integrated circuit is able to be adapted so as to indiscriminately associate at least one processing channel with a redundant component.

10. An assembly of at least one reconfigurable digital integrated circuit comprising:
multiple parallel processing channels each comprising an instance of a functional logic block (BLF),
a configuration memory of the at least one circuit, an error detector for detecting errors based on the outputs from the processing channels, and
a controller, wherein each circuit implementing a data replay mechanism and a self-test mechanism for the processing channels, and
wherein the controller being configured to command elements of the at least one digital integrated circuit so as to implement the method for protecting against reversible errors according to claim 1.

11. The assembly of at least one digital integrated circuit according to claim 10, comprising an input FIFO memory ($FIFO_e$) for supplying each processing channel with samples, an output FIFO memory ($FIFO_s$) for receiving samples from the error detector, a buffer memory (RAM) supplied with samples by the input FIFO memory ($FIFO_e$), the controller being able to command read access to the input FIFO memory ($FIFO_e$) and write access to the output FIFO memory ($FIFO_s$) and being configured to execute a replay mechanism consisting in resetting each functional logic block (BLF), suspending read access to the input FIFO memory ($FIFO_e$), suspending write access to the output FIFO memory ($FIFO_s$) and switching the input of the processing channels to the output of the buffer memory (RAM).

12. The assembly of at least one digital integrated circuit according to claim 10, furthermore comprising a self-test stimulus generator (AS) able to generate an input self-test sequence, a memory comprising a self-test sequence expected at an output of each block (BLF) and an error detector (AC) able to compare the sequence obtained at the output of each functional logic block (BLF) by injecting, at input, the input self-test sequence with the expected self-test sequence stored in a second memory.

13. The assembly of at least one digital integrated circuit according to claim 10, wherein each functional logic block (BLF) furthermore comprises a modulo logic operator (MOD) able to be applied to input data and wherein the logic functions of the functional logic block are implemented via a projection (PROJ) onto a component of an RNS base.

14. The assembly of at least one digital integrated circuit according to claim 13, furthermore comprising a dynamic range adapter (CAD) for framing numbers at an input of each functional logic block (BLF) in order to adapt their dynamic range.

15. The assembly of at least one digital integrated circuit according to claim 10, comprising a source integrated circuit, multiple slave integrated circuits and a master integrated circuit, the processing channels being distributed among the slave integrated circuits.

* * * * *